US010283514B2

(12) United States Patent
Lee

(10) Patent No.: US 10,283,514 B2
(45) Date of Patent: May 7, 2019

(54) SEMICONDUCTOR DEVICE AND METHOD OF MANUFACTURING THE SAME

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/838,493

(22) Filed: Dec. 12, 2017

(65) Prior Publication Data

US 2018/0342528 A1 Nov. 29, 2018

(30) Foreign Application Priority Data

May 26, 2017 (KR) .................. 10-2017-0065521

(51) Int. Cl.
*H01L 27/11556* (2017.01)
*H01L 27/11526* (2017.01)
*H01L 27/11573* (2017.01)
*H01L 27/11582* (2017.01)

(52) U.S. Cl.
CPC .. *H01L 27/11556* (2013.01); *H01L 27/11526* (2013.01); *H01L 27/11573* (2013.01); *H01L 27/11582* (2013.01)

(58) Field of Classification Search
CPC ........... H01L 27/11556; H01L 27/1157; H01L 27/11524; H01L 27/11582
See application file for complete search history.

(56) References Cited

U.S. PATENT DOCUMENTS 9,997,538 B2 * 6/2018 Son .................. H01L 27/11582

FOREIGN PATENT DOCUMENTS

KR 100944357 3/2010
KR 1020180098922 9/2018

* cited by examiner

Primary Examiner — David Vu
(74) Attorney, Agent, or Firm — IP & T Group LLP

(57) ABSTRACT

The semiconductor device includes a stack, a plurality of channel structures passing through the stack, a coupling structure which is disposed below the stack for coupling the channel structures with each other and has an uneven lower surface, and a source pick-up line electrically coupled with the coupling structure.

20 Claims, 11 Drawing Sheets

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2017-0065521 filed on May 26, 2017, the entire disclosure of which is incorporated herein by reference.

BACKGROUND

Field of Invention

Various embodiments of the present disclosure generally relate to an electronic device, and more particularly, to a semiconductor device and a method of manufacturing the same.

Description of Related Art

Non-volatile memory devices retain stored data regardless of power on/off conditions. Recently, as a two-dimensional nonvolatile memory device in which a single-layer memory cell is formed on a substrate has reached a limit in enhancing its degree of integration, a three-dimensional nonvolatile memory device in which memory cells are vertically stacked on a substrate has been proposed.

A three-dimensional non-volatile memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

Various embodiments of the present disclosure are directed to a semiconductor device which is configured to facilitate the manufacturing process thereof and has stable structure and improved characteristics, and a method of manufacturing the same.

An embodiment of the present disclosure may provide for a semiconductor device including: a stack; a plurality of channel structures passing through the stack; a coupling structure disposed below the stack for coupling the channel structures with each other, the coupling structure having an uneven lower surface; and a source pick-up line electrically coupled with the coupling structure.

An embodiment of the present disclosure may provide for a semiconductor device including: a stack; a plurality of channel structures passing through the stack; a source layer disposed below the stack and including an opening having an uneven lower surface; and a coupling structure formed in the opening of the source layer and coupling the plurality of channel structures with each other.

An embodiment of the present disclosure may provide for a method of manufacturing a semiconductor device, including: forming a first stack on a source layer; forming first openings which pass through the first stack; forming a second opening in the source layer, the second opening coupling the first openings with each other; forming channel structures in the respective first openings; forming a coupling structure in the second opening, the coupling structure coupling the channel structures with each other; and forming a source pick-up line passing through the first stack and coupled to the coupling structure.

DETAILED DESCRIPTION

Figure 1A:
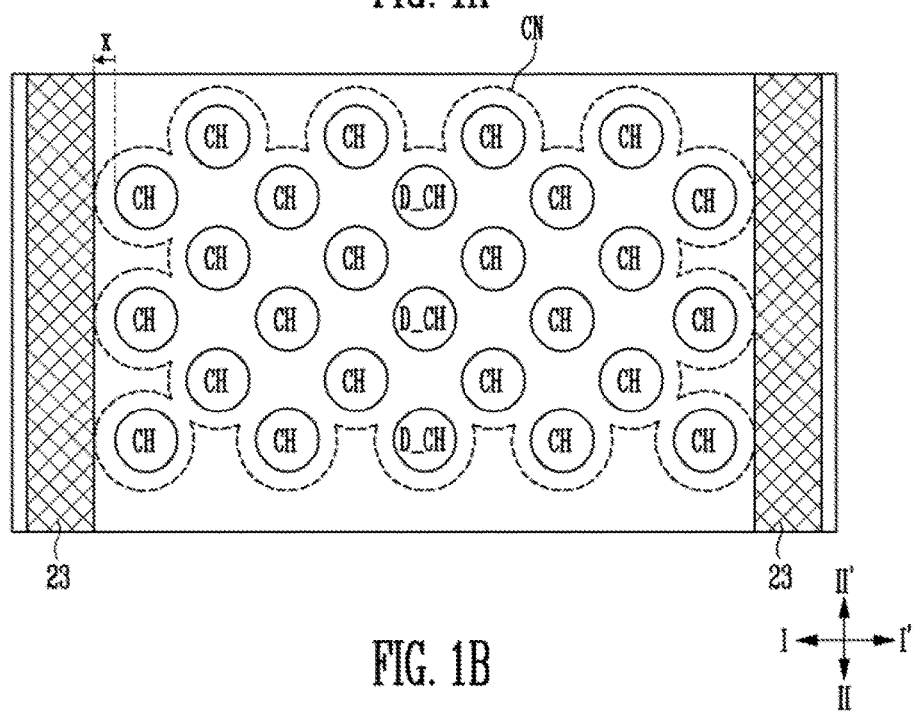
FIGS. 1A and 1B are views illustrating the structure of a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or ore components, steps operations, and elements exist or are added.

Furthermore, unless defined otherwise all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1B:
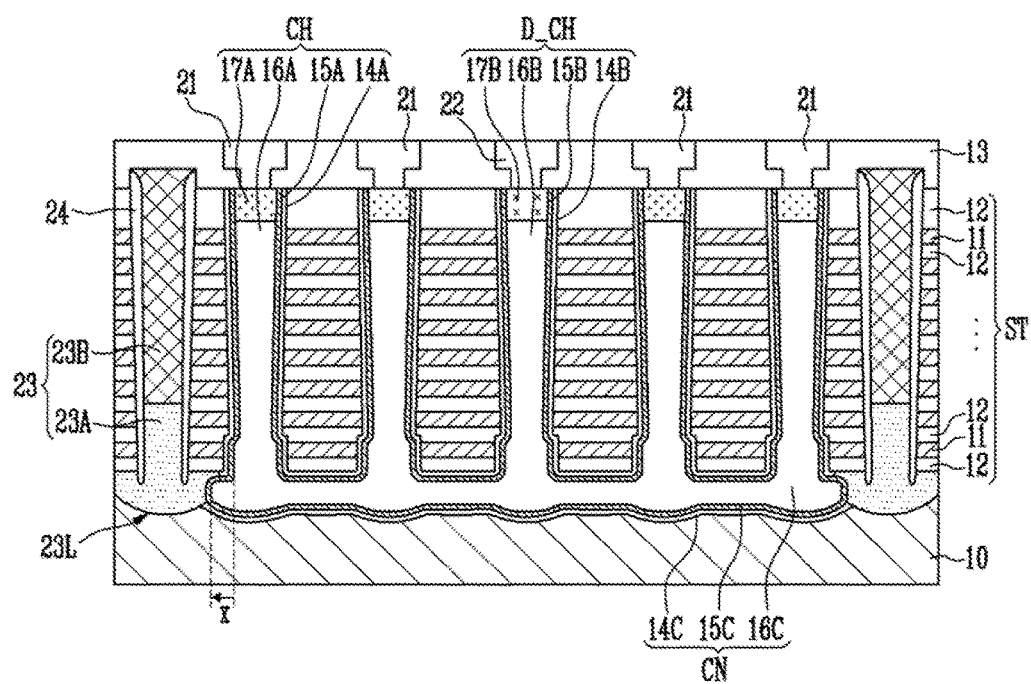

FIGS. 1A and 1B are views illustrating the structure of a semiconductor device according to an embodiment of the present disclosure. FIG. 1A is a layout diagram, FIG. 1B is a sectional view.

Referring to FIGS. 1A and 1B, a semiconductor device according to an embodiment of the present disclosure may include a stack ST, channel structures CH passing through the stack ST, a coupling structure CN disposed below the stack ST, and a source pick-up line 23 passing through the stack ST. The semiconductor device may further include a dummy channel structure D_CH passing through the stack ST, a source layer 10, bit lines 21, and at least one well pick-up line 22.

The stack ST may include conductive layers 11 and insulating layers 12 which are alternately stacked. Each conductive layer 11 may be a gate electrode of a memory cell, a select transistor, or the like, and made of polysilicon, polysilicon containing material, a suitable meta or metal containing material. For example, each conductive layer 11 may be made of or include a metal such as tungsten. The insulating layers 12 may insulate the stacked conductive layers 11 from each other, and may be made of or include a suitable insulating material such as, for example, an oxide. For example, at least one uppermost conductive layer 11 may be a gate electrode of a drain select transistor, at least one lowermost conductive layer 11 may be a gate electrode of a source select transistor, and the other conductive layers 11 may be gate electrodes of memory cells. In this case, at least one source select transistor, a plurality of memory cells, and at least one drain select transistor may be coupled in series to configure a memory string. The memory string may have a vertical orientation.

The stack ST may be disposed on the source layer 10. The source layer 10 may be made of any suitable semiconductor material or any suitable conductive material including, for example, polysilicon. A peripheral circuit (not shown) may be disposed below the source layer 10 as is well known in the art. An interlayer insulating layer 13 may be disposed on the stack ST. The bit lines 21, and the well pick-up line 22, may be disposed in the interlayer insulating layer 13.

Each channel structure CH may include a channel pattern 15A passing through the stack ST. Each channel pattern 15A may be a semiconductor pattern made of a semiconductor material including for example, silicon (Si), and germanium (Ge). Each channel pattern 15A may have a solid structure, or a tubular structure in which a central region thereof is open. In the case where each channel pattern 15A has a tubular structure, as in the example of FIGS. 11 and 1B, the channel pattern 15A may be filled with a gap fill insulating pattern 16A made of any suitable insulating material. Each channel pattern 15A may have a cross-section such as a circle, a cylinder, an oval, a rectangle or a polygon.

Each of the channel structures CH may further include a memory pattern 14A enclosing the side wall of the corresponding channel pattern 15A. The memory pattern 14A may include a tunnel insulating layer, a data storage layer and an electric charge blocking layer which successively enclose the sidewall of the channel pattern 15A. The data storage layer may include a floating gate, a charge trap layer, a nitride, a phase-change material, variable resistance material, nanodots and so on.

Each channel structure CH may further include a first pad 17A disposed on the corresponding gap fill insulating pattern 16A. The first pad 17A may come into contact with the corresponding channel pattern 15A. The channel pattern 15A and the corresponding bit line 21 may be coupled to each other by the first pad 17A. The first pad 17A may include an N-type impurity.

The channel structures CH may be arranged in rows in a first direction I-I' and in columns in a second direction II-II' intersecting the first direction I-I'. The channel structures CH may be alternately arranged such that the centers of adjacent channel structures are offset from each other. For example, the channel structures forming a column in the II-II' direction are positioned at every other intersection point with the rows formed by the channel structures arranged in the I-I' direction. Likewise, the channel structures that form a row in the I-I' direction are positioned at every other intersection point with the columns formed by the channel structures arranged in the II-II' direction. Hence, as illustrated in FIG. 1A, five channel structures CH disposed adjacent to each other in the first direction and the second direction form a rectangle with four channel structures at the corners of the rectangle and one channel structure CH at the center of the rectangle formed by the four channel structures CH. The number of channel structures in the columns and in the rows that make up a single memory block may vary by design choice. In an embodiment eight or nine channel columns may be arranged in a single memory block.

The dummy channel structures D_CH may be similar to the channel structures CH, and may be made of materials that are similar to the materials used for the channel structures CH. Each of the dummy channel structures D_CH may include a dummy channel pattern 15B, a dummy memory pattern 14B, a dummy gap fill insulating pattern 16B, and a second pad 17B. The second pad 17B may come into contact with the dummy channel pattern 15B. The dummy channel pattern 15B and the corresponding well pick-up line 22 may be coupled to each other by the second pad 17B. The second pad 17B may include an impurity of a type different from that of the impurity included in the first pad 17A. For example, the second pad 17B may include a P-type impurity.

The dummy channel pattern 15B corresponds to the channel pattern 15A, the dummy memory pattern 14B corresponds to the memory pattern 14A, and the dummy gap fill insulating pattern 16B corresponds to the gap fill insulating pattern 16A; therefore, detailed descriptions of these structures are omitted to avoid obscuring the description with repetitive, redundant explanations.

The dummy channel structures D_CH may be disposed between the channel structures CH. For example, the dummy channel structures D_CH may be arranged in a column along the second direction such that the centers of the dummy channel structures D_CH are misaligned from the centers of the corresponding channel structures C_H adjacent thereto in the first direction I-I'. Generally, fewer dummy channel structures D_CH than channel structures C_H will be disposed in each memory block. For example, in the case where a single memory block includes first to nine channel columns (channel structure columns and dummy structure columns) that are successively arranged, a single dummy channel column may be disposed as a fifth channel column between a fourth channel column and a sixth channel column.

The coupling structure CN is provided to couple the channel structures CH to each other, and is disposed between the source layer 10 and the stack T. In the case where the semiconductor device includes the dummy channel structures D_CH, the coupling structure CN may couple the dummy channel structures D_CH with each other, the channel structures C_CH with each other, and the channel structures CH and the dummy channel structures D_CH to each other.

The coupling structure CN is coupled with the source pick-up line 23, and provides a current path between the source pick-up line 23 and the channel structures CH. Therefore, the coupling structure CN has a large width and protrudes toward the source pick-up line 23 so that the coupling structure CN may be easily coupled with the source pick-up line 23. In other words, the sidewall of a coupling pattern 15C protrudes toward the source pick-up line 23 by a distance X from the sidewall of the channel pattern 15A. The coupling structure CN may have an uneven lower surface. For instance, the coupling structure CN may have a lower surface including a plurality of hemispherical shape surface sections alternating with substantially even lower surface portions. The hemispherical portions of the lower surface of the coupling portion lay be substantially aligned with the channel structures CH and D_CH.

The coupling structure CN may include the coupling pattern 15C and a dummy memory pattern 14C. The coupling pattern 15C may be made of a semiconductor material including, for example, silicon (Si), germanium (Ge) and the like. The coupling pattern 15C may have a solid structure, or a tubular structure in which a central region thereof is open. In the case where the coupling pattern 15C has a tubular structure, the coupling pattern 15C may be filled with a dummy gap fill insulating pattern 16C.

The dummy memory pattern 14C may be a multilayer enclosing an outer surface of the coupling pattern 15C, and include at least one of a tunnel insulating layer, a data storage layer, or an electric charge blocking layer. The dummy memory pattern 14C may include an opening through which a portion of the coupling pattern 15C is exposed. For example, the opening may expose the sidewall of the coupling pattern 15C.

The channel structures CH, the dummy channel structures $D_{13}$ CH and the coupling structure CN may be formed through the same process. For instance, the channel patterns 15A, the dummy channel patterns 158 and the coupling pattern 15C may form a single integrated semiconductor layer, and have different functions depending on regions of the semiconductor layer. The memory pattern 14A, the dummy memory pattern 14B and the dummy memory pattern 14C may also form a single integrated layer. The gap fill insulating pattern 16A, the dummy gap fill insulating pattern 16B and the dummy gap fill insulating pattern 16C may also form a single integrated layer.

The source pick-up line 23 may pass through the stack ST and be coupled with the source layer 10 and the coupling structure CN. The source pick-up line 23 may extend in the second direction II-II'. The source pick-up line 23 may have an uneven lower surface 23L having, for example, a hemispherical lower surface. The hemispherical lower surface 23L of the source pick-up line 23 may be wider in the horizontal direction than the width of the lower portion of the source pick-up line 23 that penetrates through the stack ST. As illustrated in FIG. 1B, the part of the source pick-up line 23 that penetrates through the stack ST may have a slightly tapered shape with a width at the top being larger than the width at the bottom.

The source pick-up line 23 may make direct contact with the coupling structure CN. For example, the source pick-up line 23 may make direct contact with the sidewall of the coupling pattern 15C which is exposed through an opening of the dummy memory pattern 14C. In this case, the source pick-up line 23 may be a multilayer which includes a first layer 23A making direct contact with the coupling structure CN and a second layer 23B having resistance lower than that of the first layer 23A. The first layer 23A may be, for example, an N-type polysilicon layer. The second layer 23B may be, for example, a metal or metal containing layer including, for example a tungsten or tungsten containing layer.

The sidewall of the source pick-up line 23 may be enclosed by an insulating spacer 24. The insulating spacer 24 may be made of any suitable insulating material including, for example, an oxide layer or a nitride layer, and may function to insulate the source pick-up line 23 from the conductive layers 11.

The source layer 10 may make direct contact with the source pick-up line 23. For example, the source layer 10 may make direct contact with the first layer 23A of the source pick-up line 23. The dummy memory pattern 14C may be interposed between the source layer 10 and the coupling pattern 15C. Therefore, the source layer 10 may be coupled with the coupling pattern 15C through the source pick-up line 23, rather than being directly coupled with the coupling pattern 15C. In other words, the source layer 10 may be electrically coupled with the coupling structure CN through the source pick-up line 23.

According to the above-described structure, the channel structures CH and the source pick-up line 23 may be easily coupled with each other using the coupling structure CN having the uneven lower surface. As a result, during a read operation, a current path may be provided between the bit lines 21, the channel structures CH the coupling structure CN, the source pick-up line 23, and the source layer 10. Furthermore, during an erase operation, because a hole movement path may be provided between the well pick-up line 22, the dummy channel structures D_CH the coupling structure CN and the channel structures CH, a sufficient amount of holes may be supplied to the memory cells.

Figure 2A:
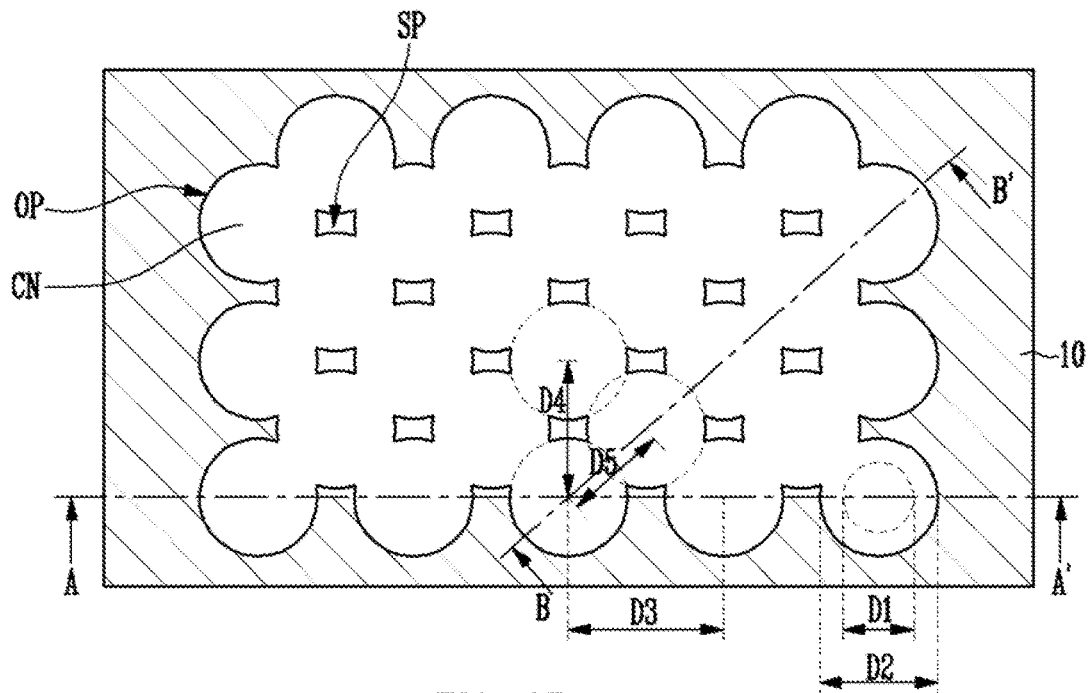
FIGS. 2A to 2C are views illustrating a coupling structure of a semiconductor device and the structure of a source layer of the semiconductor device according to an embodiment of the present disclosure.
Figure 2B:
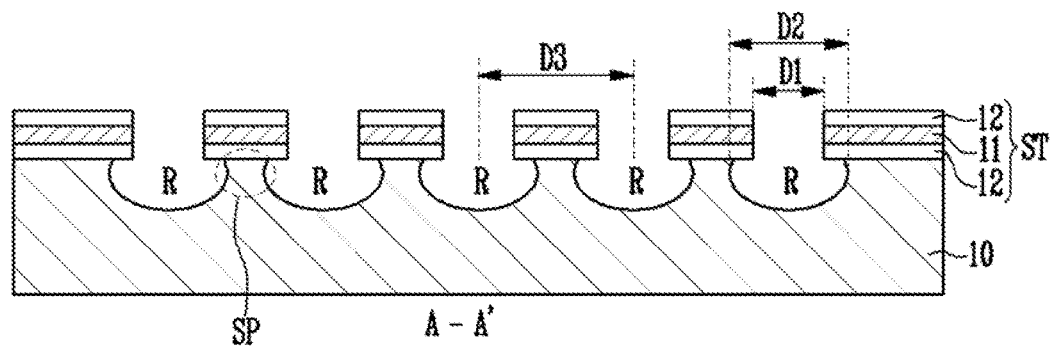
Figure 2C:
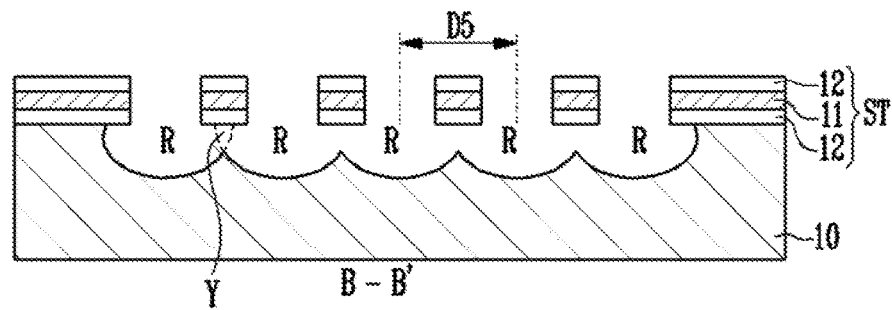

FIGS. 2A to 2C are views illustrating a coupling structure CN of a semiconductor device and the structure of a source layer 10 according to an embodiment of the present disclosure. FIG. 2A is a layout diagram. FIG. 2B is a sectional view taken along line A-A' of FIG. 2A. FIG. 2C is a sectional view taken along line B-B' of FIG. 2A.

Referring to FIGS. 2A to 2C, the source layer 10 includes an opening OP having an uneven lower surface, and the coupling structure CN is formed in the opening OP of the source layer 10. The opening OP may include a plurality of recess regions R each of which has a hemispherical shape. The recess regions R are arranged in the first direction I and the second direction II intersecting the first direction I. The recess regions R may be alternately arranged such that the centers thereof are offset from each other matching the pattern of the channel and dummy channel structures. For example, five adjacent recess regions R are disposed adjacent to each other in the first direction I and the second direction II so that four of them are positioned at the vertices of a rectangle and the fifth of them is positioned at the center of the of the rectangle formed by the four recess regions R.

The recess regions R may be disposed at positions corresponding to the respective channel structures CH and the respective dummy channel structures D_CH. For example, the recess regions R may be disposed below the respective channel structures CH and the respective dummy channel structures D_CH. The center of each of the recess regions R may be aligned with the center of a corresponding one of the channel structures CH and the dummy channel structures D_CH. However, each recess region R may have a diameter greater than that of each channel structure CH or each dummy channel structure D_CH (D1<D2).

The recess regions R disposed adjacent to each other in the first direction I are spaced apart from each other, and the recess regions R disposed adjacent to each other in the second direction II are spaced apart from each other. On the other hand, the recess regions R disposed adjacent to each other in a third direction III intersecting the first and second directions I and II may overlap each other (refer to reference character "Y"). For instance, the distance between the centers of the recess regions R disposed adjacent to each other in the first direction I is designated as D3, the distance between the centers of the recess regions R disposed adjacent to each other in the second direction II is designated as D4, and the distance between the centers of the recess regions R disposed adjacent to each other in the third direction III is designated as D5. In this case, D3 may be greater than D5 (D3>D5), and D4 may be greater than D5 (D4>D5).

In the case where the recess regions R partially overlap each other, the opening OP may have a mesh-shaped cross-section. The source layer 10 may include supports SP which are disposed between the recess regions R disposed adjacent to each other and protrude between the respective recess regions R to support the stack ST. Likewise, since the coupling, structure CN is formed in the opening OP, the coupling structure CN may also have a mesh-shaped lower surface. In this case, the supports SP of the source layer 10 protrude in the coupling structure CN, and the dummy memory pattern 14C and the coupling pattern 15C of the coupling structure CN enclose the sidewalls of the supports SP of the source layer 10.

The distance between the recess regions R and the diameter of each recess region R may be changed to various values depending on design conditions. For example, the recess regions R disposed adjacent to each other in the first and second directions I and II may overlap each other. In this case, the source layer 10 may not include the supports SP.

Figure 3A:
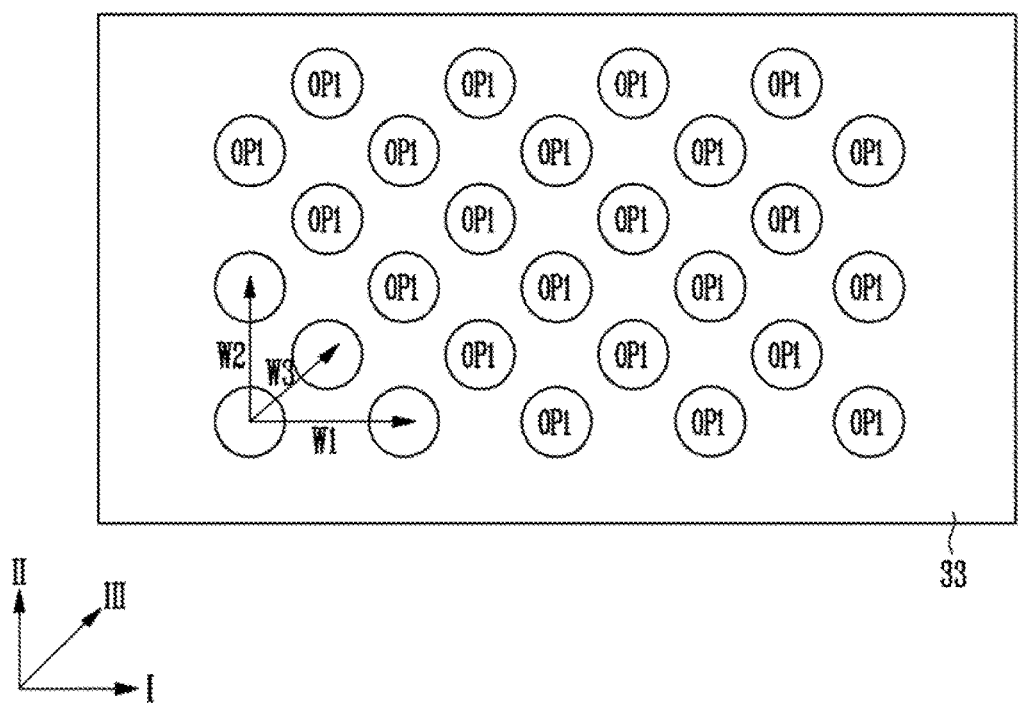
FIGS. 3A, 3B, 4A, 4B and 5 to 14 are views illustrating a method of manufacturing a semiconductor device according to an embodiment of the present disclosure.

FIGS. 3A, 3B, 4A, 4B and 5 to 14 are views illustrating a method of manufacturing a semiconductor device according to an embodiment of the present disclosure. FIGS. 3A and 4A are layout diagrams. FIGS. 3B, 4B and 5 to 14 are sectional views. Hereinbelow, repetitive explanation will be omitted if deemed redundant.

Figure 3B:
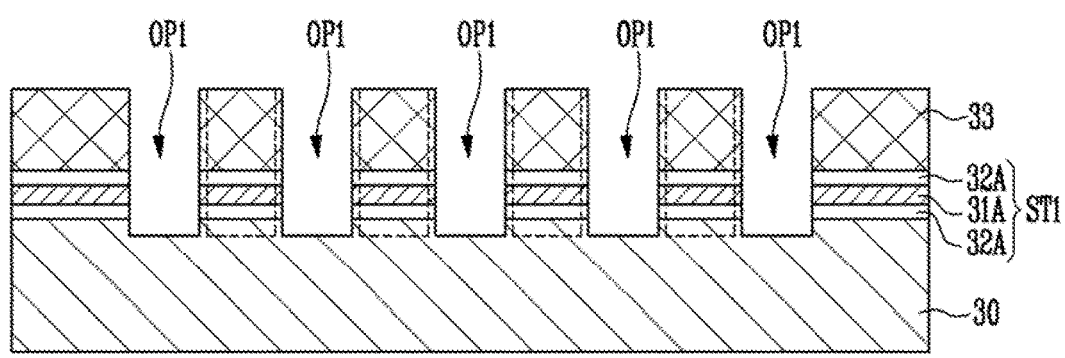
Figure 4A:
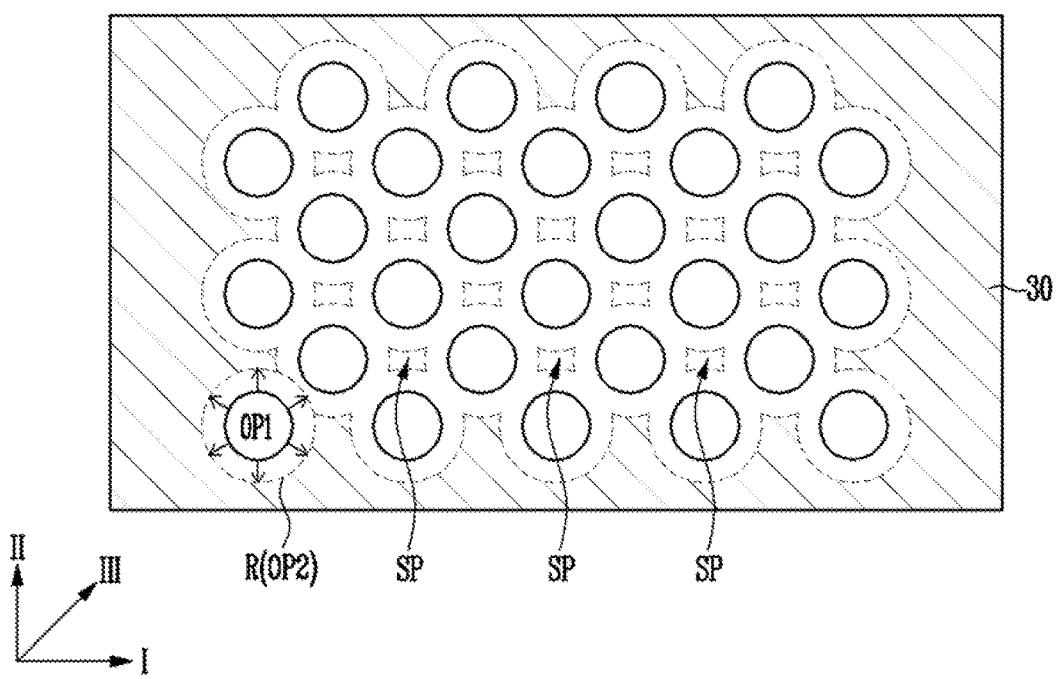

Referring to FIGS. 3A and 3B, a first stack ST1 is formed on the source layer 30. The first stack ST1 may include one or more first-material layers 31A and one or more second-material layers 32A which are alternately stacked.

The first material layers 31 may be provided to form gate electrodes of memory cells, select transistors, and the like. The second material layers 32 may be provided to insulate the stacked gate electrodes from each other. The first material layers 31A may be made of material having a high etching selectivity to the second material layers 32A. For example, the first material layers 31A may be sacrificial layers including nitride or the like, and the second material layers 32A may be insulating layers including oxide or the like. Alternatively, the first material layers 31A may be conductive layers including polysilicon, tungsten, or the like, and the second material layers 32A may be insulating layers including oxide or the like. As a further alternative, the first material layers 31A may be conductive layers including doped polysilicon or the like, and the second material layers 32A may be sacrificial layers including undoped polysilicon or the like.

Thereafter, first openings OP1, are formed to pass through the first stack ST1 such that the source layer 30 is exposed through the first openings OP1. For example, a mask pattern 33 is formed on the first stack ST1. Thereafter, the first stack ST1 is etched using the mask pattern 33 as an etch barrier to form the openings OP1. Each of the openings OP1 penetrates through the first stack ST1 and exposes the source layer 30. The source layer 30 may also be etched by a predetermined depth in forming the first openings OP1.

The first openings OP1 are arranged in the first direction I and the second direction II intersecting the first direction I in a pattern as described earlier for the channel structures and the dummy channel structures. Hence, the first openings OP1 may be alternately arranged such that the centers thereof are offset from each other so that every five adjacent openings OP1, four are disposed at the vertices of a rectangle and the fifth is disposed at the center of the rectangle.

The distance between the respective first openings OP1 may be determined taking into account the width of the recess regions to be formed through a following process. For example, when it is desired to overlap the recess regions, the first openings OP1 may be disposed at comparatively small intervals. When it is desired to separate the recess regions from each other, the first openings OP1 may be disposed at comparatively large intervals. Furthermore, the first openings OP1 may be disposed at different intervals depending on directions. For example, the distance between the centers of the first openings OP1 disposed adjacent to each other in the first direction I is designated as W1, the distance between the centers of the first openings OP1 disposed adjacent to each other in the second direction II is designated as W2, and the distance between the centers of the first openings OP1 disposed adjacent to each other in the third direction III is designated as W3. In this case, W1 may be greater than W3 (W1>W3), and W2 may be greater than W3 (W2>W3). For reference, the dotted lines of FIG. 3B denote the respective first openings OP1 disposed behind the cross-section shown in FIG. 3B.

Figure 4B:
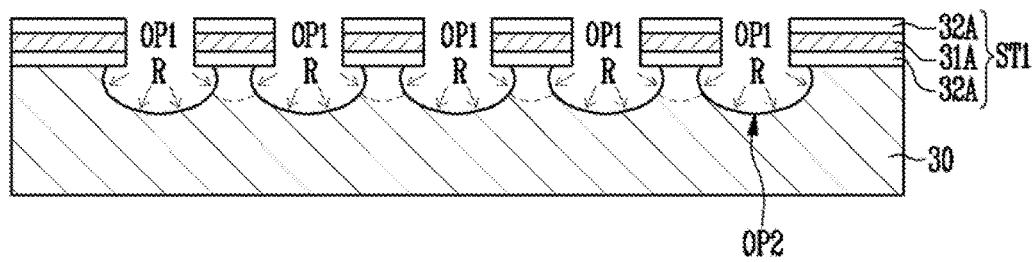

Referring to FIGS. 4A and 4B, the mask pattern 33 is removed. Thereafter, second openings OP2 through which the first openings OP1 are coupled with each other are formed in the source layer 30. For example, recess regions R are formed below the respective first openings OP by selectively etching the source layer 30 exposed through the first openings OP1. Since the source layer 30 is etched through an isotropic etching process (refer to the arrow), each of the recess regions R may be formed in a hemispherical shape.

Initial recess regions R are separated from each other. However, as the etching process is performed, the width of each of the recess regions R is increased, whereby the recess regions R disposed adjacent to each other are coupled with each other. In this way, the second openings OP2 through which the first openings OP1 are coupled with each other may be formed. For reference, the dotted lines of FIG. 4B denote the respective recess regions R disposed behind the cross-section shown in FIG. 4B.

The shape of each of the second openings OP2 may be changed depending on a method of arranging the first openings OP1, the width of each recess region R, etching conditions of the source layer 30, an etching rate of the source layer 30 etc. In the case where the distance between the first openings OP1 disposed adjacent to each other is relatively small, or the etching rate of the source layer 30 is relatively high, the adjacent recess regions R are overlapped and coupled with each other. In the case where the distance between the adjacent first opening OP1 is relatively large, or the etching rate of the source layer 30 is relatively low, the adjacent recess regions R may be spaced apart and separated from each other.

For example, since the recess regions R disposed adjacent to each other in the third direction III are disposed at comparatively small intervals the adjacent recess regions R are overlapped and coupled with each other. On the other hand, since the recess regions R disposed adjacent to each other in the first direction I or in the second direction II are disposed at comparatively large intervals, the adjacent recess regions R are separated from each other. Therefore, portions of the source layer 30 remain between the recess regions R disposed adjacent to each other in the first direction I or in the second direction II. Each of the remaining portions of the source layer 30 functions as a support SP. The second opening OP2 has a mesh-shaped cross-section.

For reference, in the case where the etching rate of the source layer 30 is increased, that is, the width of each of the recess regions R is increased, the recess regions R may be coupled with each other without the support SP. In this case not only the recess regions R disposed adjacent to each other in the first direction I but also the recess regions R disposed adjacent to each other in the second direction II may be overlapped and coupled with each other.

Figure 5:
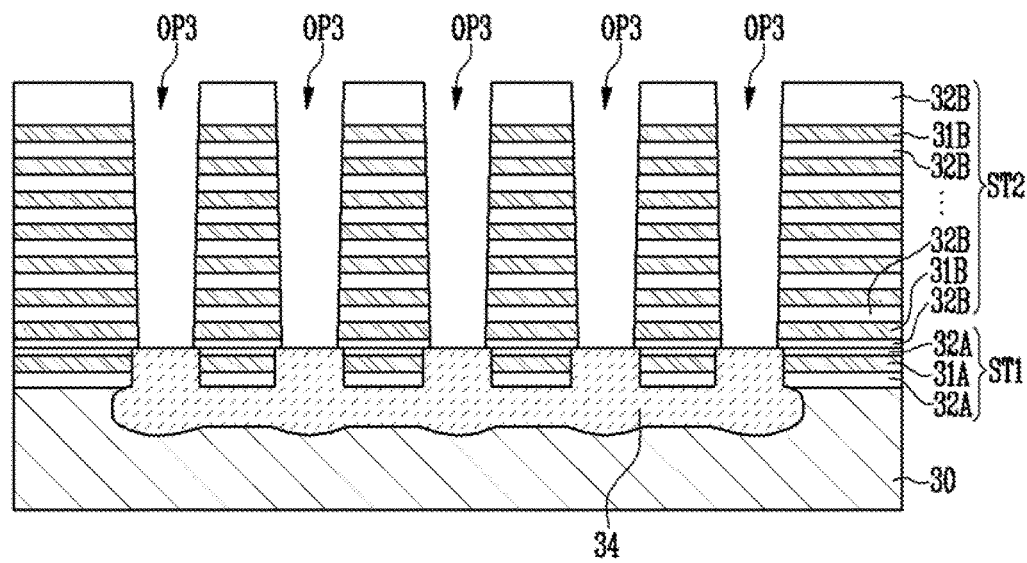

Referring to FIG. 5, a sacrificial layer 34 is formed in the first and second openings OP1 and OP2. For example, the sacrificial layer 34 is formed on the first stack ST1 such that the first and second openings OP1 and OP2 are filled with the sacrificial layer 34. Thereafter, the sacrificial layer 34 is planarized until a surface of the first stack ST1 is exposed. Here, an uppermost second material layer 32A included in the first stack ST1 may be etched by a predetermined thickness.

The sacrificial layer 34 may be made of material having a high etching selectivity to the source layer 30, the first material layers 31A and the second material layers 32A. In the case where the source layer 30 is a polysilicon layer, the first material layers 31A is a nitride layer, and the second material layers 32A is an oxide layer, the sacrificial layer 34 may include titanium nitride.

Thereafter, a second stack ST2 is formed on the first stack ST1. The second stack ST2 may include first material layers 31B and second material layers 32B which are alternately stacked. The first material layers 31B may be provided to form gate electrodes of memory cells, select transistors, and the like. The second material layers 32B may be provided to insulate the stacked gate electrodes from each other. Here, the first material layers 31B are made of material having a high etching selectivity to the second material layers 32B. For example, the first material layers 31B may be sacrificial layers, and the second material layers 32B may be insulating layers. Alternatively, the first material layers 31B may be conductive layers, and the second material layers 32B may be insulating layers. As a further alternative, the first material layers 31B may be conductive layers, and the second material layers 32B may be sacrificial layers including undoped polysilicon or the like.

For reference, the first stack ST1 may be provided to form at least one lower select transistor, and the second stack ST2 may be provided to form memory cells and at least one upper transistor. The first material layers 31A and the first material layers 31B may be made of the substantially same material. The second material layers 32A and the second material layers 32B may be made of the substantially same material.

Subsequently, third openings OP3 are formed to pass through the second stack ST2 and are coupled with the respective first openings OP1. The third openings OP3 may be disposed in a pattern that corresponds to the pattern of the respective first openings OP1. The width of each third opening OP3 may be reduced from an upper end thereof to a lower end.

Figure 6:
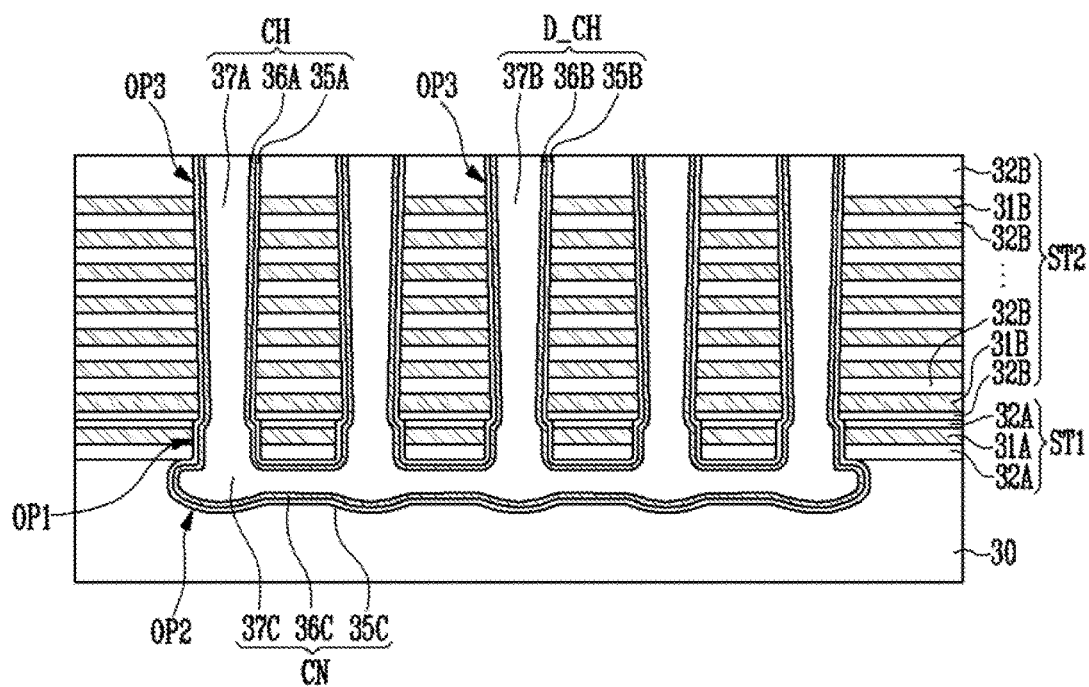

Referring to FIG. 6, the sacrificial layer 34 is removed through the third openings OP3. Consequently, the first openings OP1 and the second openings OP2 open again, and the first to third openings OP1 to OP3 are integrally coupled with each other. The first and second stacks ST1 and ST2 over the second opening OP2 are supported by the supports SP of the source layer 30.

Thereafter, channel structures CH, dummy channel structures D_CH and a coupling structure CN are formed. Each of the channel structures CH may include a memory pattern 35A, a semiconductor pattern 36A and a gap fill insulating pattern 37A which are disposed in the corresponding first and third openings OP1 and OP3. Each of the dummy channel structures, D_CH may include a dummy memory pattern 35B, a dummy semiconductor pattern 36B and a dummy gap fill insulating pattern 37B which are disposed in the corresponding first and third openings OP1 and OP3. The coupling structure CN may include a dummy memory pattern 3C, a dummy semiconductor pattern 36C and a dummy gap fill insulating pattern 37C which are disposed in the second opening OP2.

For example, the memory layers 35A to 35C, the semiconductor layers 36A to 36C and the gap fill insulating layers 37A to 37C may be successively formed in the first to third openings OP1 to OP3 whereby the channel structures CH, the dummy channel structures D_CH and the coupling structure CN may be formed. The memory layers 35A to 35C may include at least one of an electric charge blocking layer, a data storage layer or a tunnel insulating layer. The data storage layer may include a floating gate, charge trap material, nitride, phase-change material variable resistance material, nanodots, and so forth.

Figure 7:
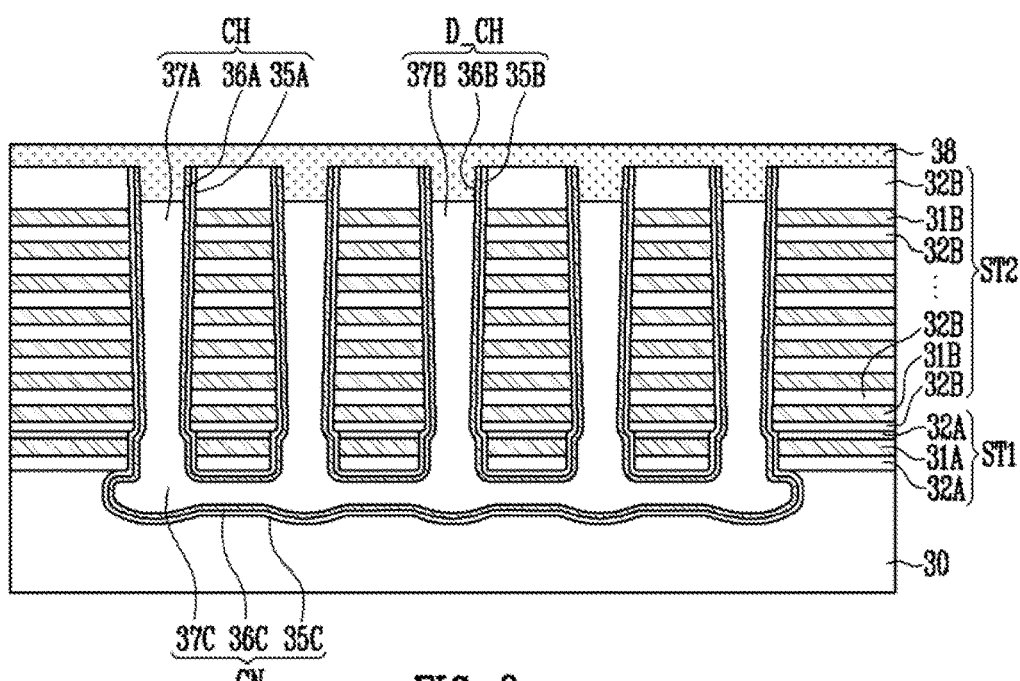

Referring to FIG. 7, each gap fill insulating layer 37A, 37B is etched by a predetermined depth, whereby upper regions of the third openings OP3 open again. Thereafter, a first conductive layer 38 is formed on the second stack ST2 so that reopened regions are filled with the first conductive layer 38. The first conductive layer 38 may include an N-type impurity and be a polysilicon layer.

Figure 8:
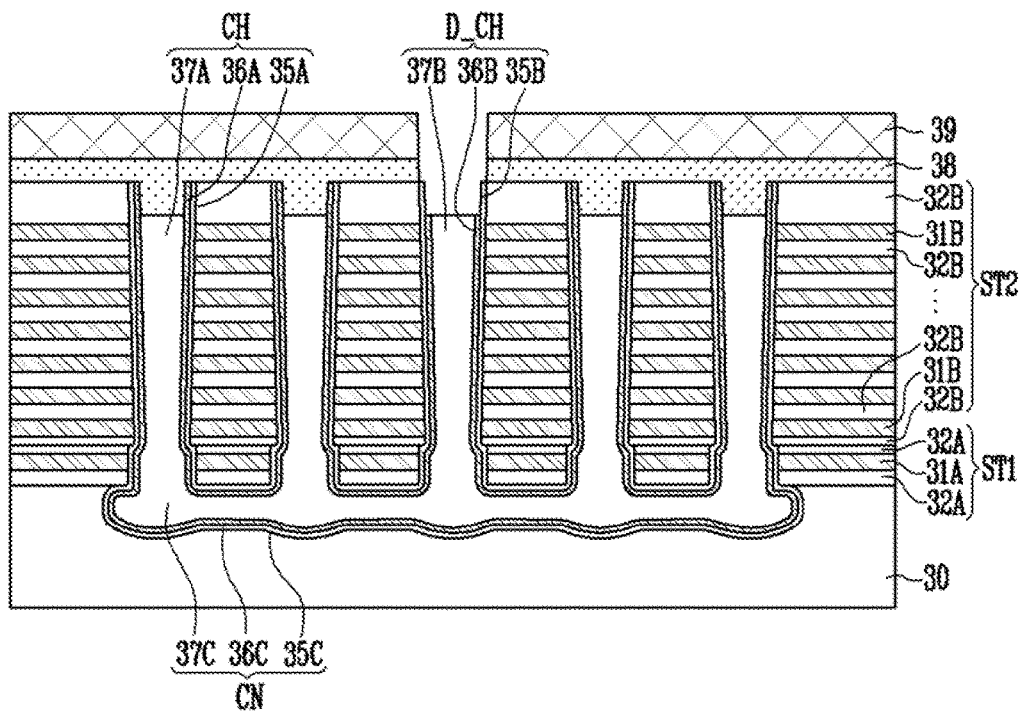

Referring to FIG. 8, regions of the first conductive layer 38 which correspond to the dummy channel structures D_CH are selectively removed. For instance, a mask pattern 39 including an opening through which the regions corresponding to the dummy channel structures D_CH are exposed is formed on the first conductive layer 38. The first conductive layer 38 is thereafter etched using the mask pattern 39 as an etch barrier. During a process of etching the first conductive layer 38, the dummy channel patterns 366 may be etched along with the first conductive layer 38. In this way upper regions, of the third openings OP3 in which the dummy channel structures D_CH are disposed reopen.

Figure 9:
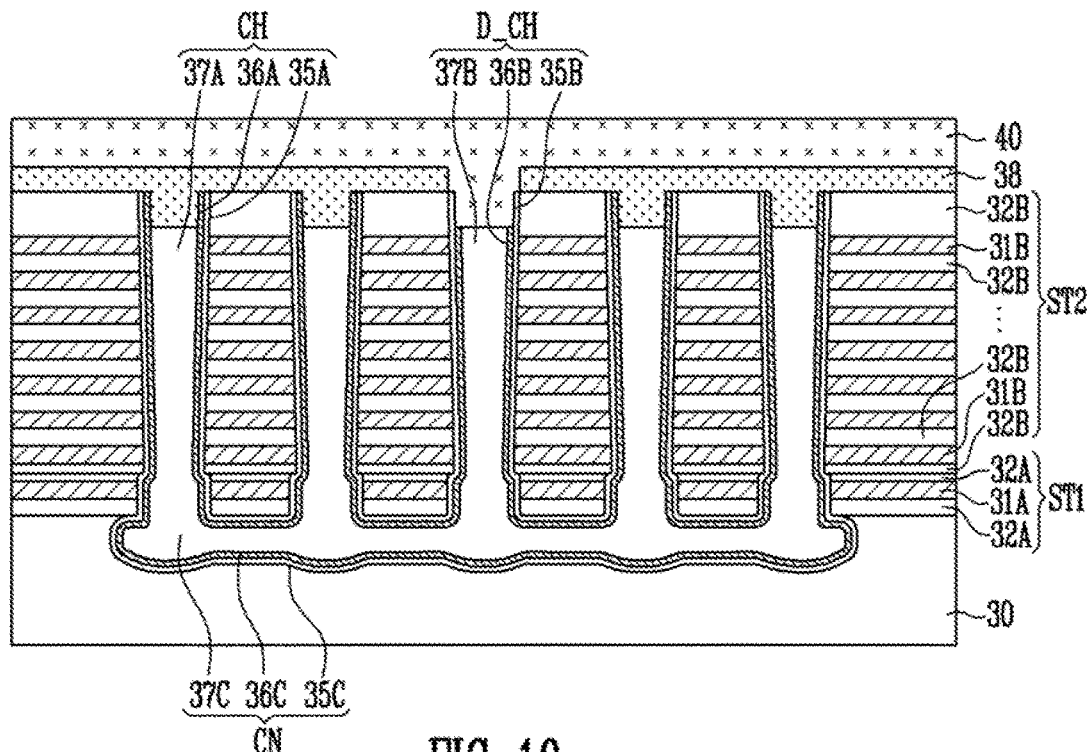

Referring to FIG. 9, the mask pattern 39 is removed, and a second conductive layer 40 is thereafter formed. The second conductive layer 40 may include an impurity of a type different from that of the first conductive layer 38. For example, the second conductive layer 40 may be a polysilicon layer including a P-type impurity.

Figure 10:
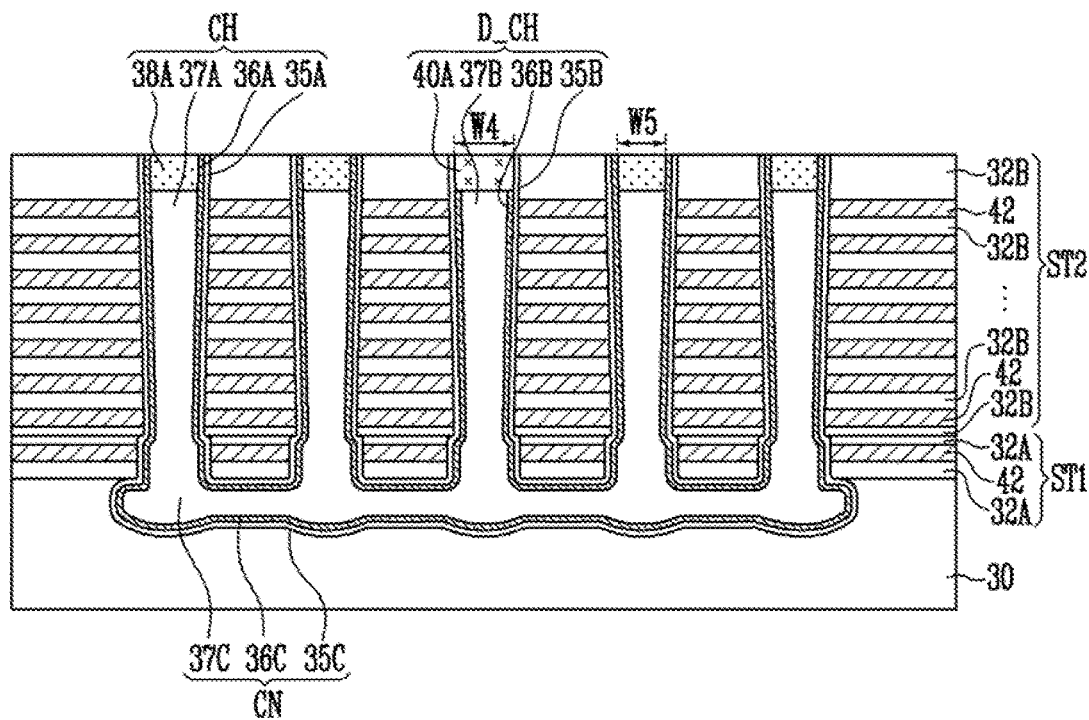

Referring to FIG. 10, the first and second conductive layers 38 and 40 are planarized until a surface of the second stack ST2 is exposed, whereby first pads 38A and second pads 40A are formed. Each of the first pads 38A may be disposed on the corresponding gap fill insulating pattern 37A and be disposed in the corresponding channel pattern 36A. Each of the second pads 40A may be disposed on the corresponding dummy gap fill insulating pattern 37B and disposed in an upper portion of the corresponding dummy channel pattern 36B. In addition, when the dummy channel patterns 36B are etched along with the first conductive layer 38 as described above, each second pad 40A may have a width greater than that of each first pad 38A (W4>W5).

In this way, each of the channel structures CH may include the memory pattern 35A, the semiconductor pattern 36A, the gap fill insulating pattern 37A and the first conductive pattern 38A. Each of the dummy channel structures D_CH may include the dummy memory pattern 35B the dummy semiconductor pattern 36B the dummy gap fill insulating pattern 37B and the second pad 40A.

In an embodiment, the first and second pads 38A and 40A may be formed using only the first conductive layer 38. For example, the first and second pads 38A and 40A may be formed by planarizing the first conductive layer 38 of FIG. 7. Thereafter, impurities may be selectively doped into the second pads 40A.

Figure 11:
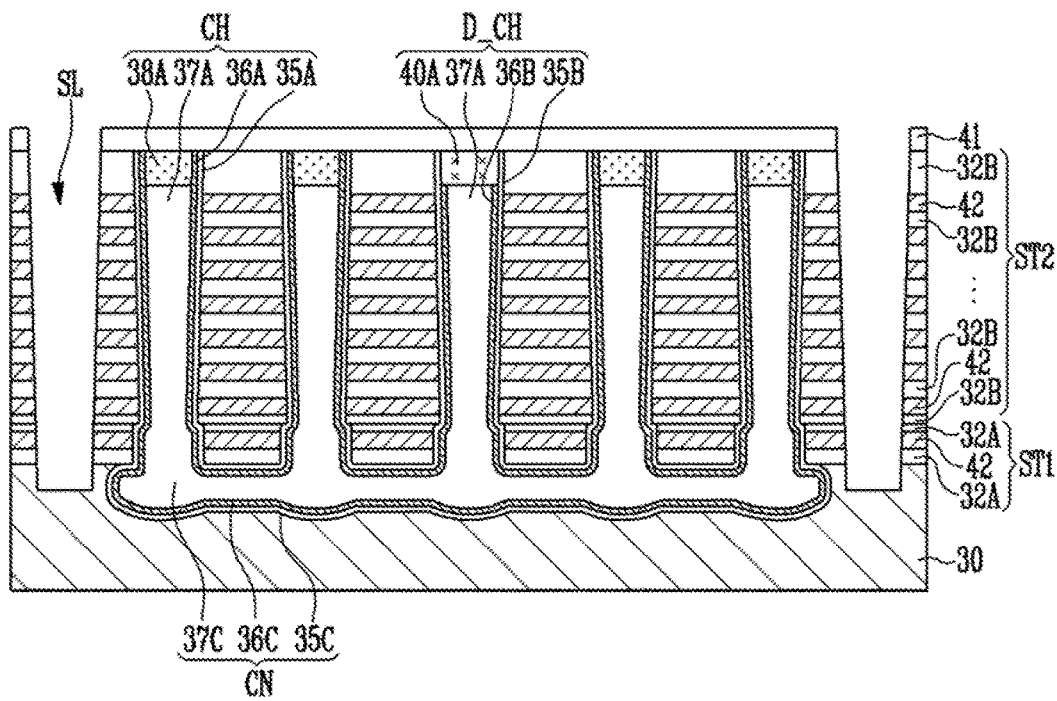

Referring to FIG. 11, a first interlayer insulating layer 41 is formed on the second stack ST2, and a slit SL is thereafter formed to pass through the first and second stacks ST1 and ST2. The slit SL may be formed to a predetermined depth such that the source layer 30 is exposed, and extend inside an upper portion of the source layer 30.

Thereafter, the first material layers 31A and 316 or the second material layers 32A and 32B are replaced with third material layers 42 through the slit SL. For example, in the case where the first material layers 31A and 31B are sacrificial layers and the second material layers 32A and 32B are insulating layers, conductive layers may substitute for the first material layers 31A and 31B. Alternatively, in the case where the first material layers 31A and 31B are conductive layers and the second material layers 32A and 32B are insulating layers, the first material layers 31A and 31B are silicidized. As a further alternative, in the case where the first material layers 31A and 31B are conductive layers and the second material layers 32A and 32B are sacrificial layers, insulating layers may substitute for the second material layers 32A and 32B.

Figure 12:
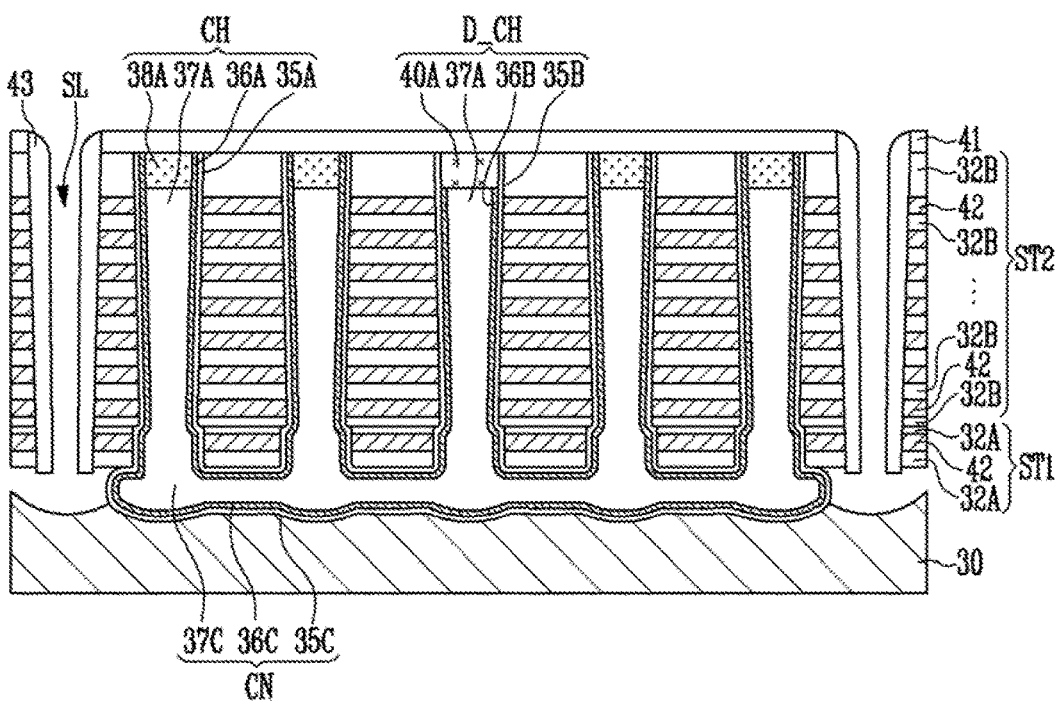

Referring to FIG. 12 an insulating spacer 43 is formed on an inner wall of the slit SL. The insulating spacer 43 functions not only to protect the first and second stacks ST1 and ST2 during a following process, but also to insulate a source pick-up line from conductive layers (e.g., the third material layers 42). Therefore, the insulating spacer 43 is formed to a sufficient thickness taking into account a loss thereof during the following process.

Thereafter, the source layer 30 exposed through the slit SL is partially etched, whereby the coupling structure CN is exposed. For example, a lower region of the slit SL is expanded by etching the source layer 30 through an isotropic etch ng process. A dip-out process may be used when the source layer 30 is etched, and the source layer 30 may be etched in a hemispherical shape.

As described above, since the coupling structure CN includes a plurality of recess regions R each having the hemispherical shape, the coupling structure CN is disposed at a position closer to the slit SL than is each channel structure CH. Consequently, the coupling structure CN may be easily exposed by expanding the lower region of the slit SL.

Figure 13:
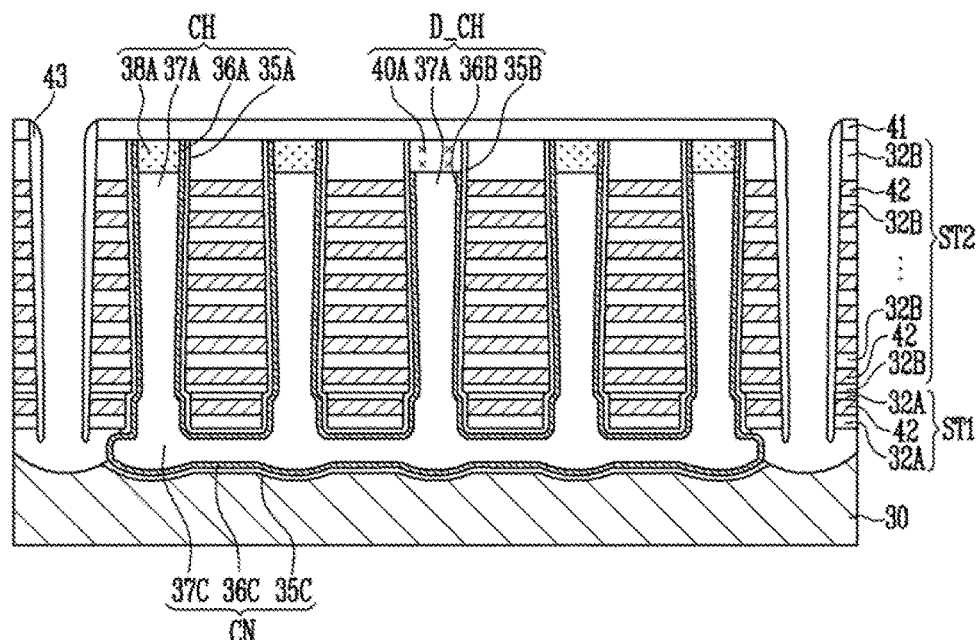

Referring to FIG. 13, the dummy memory pattern 35C exposed through the lower region of the slit SL is removed. As a result the dummy memory pattern 35C has an opening, and the dummy channel pattern 36C is exposed through the opening. During a process of removing the dummy memory pattern 35C, the insulating spacer 43 may be removed by a predetermined thickness.

Figure 14:
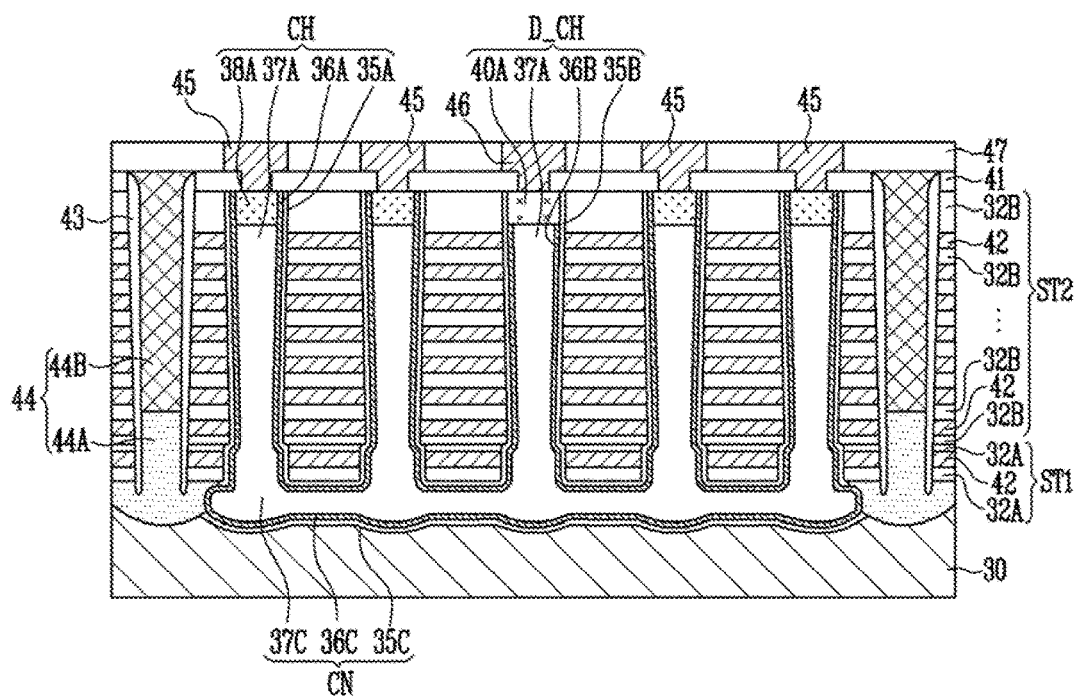

Referring to FIG. 14, a source pick-up line 44 is formed in the expanded slit SL. The source pick-up line 44 may be coupled with the source layer 30 and the coupling structure CN, and make direct contact with the source layer 30 and the dummy channel pattern 36C of the coupling structure CN. The source pick-up line 44 may include a first layer 44A with which a lower region of the expanded slit SL is filled, and a second layer 44B with which an upper region of the slit SL is filled.

For example, the first layer 44A is formed such that the lower region of the expanded slit SL is filled with the first layer 44A. Thereafter, the second layer 44B is formed. The first layer 44A may be a polysilicon layer. The second layer 44B may be a metal layer having resistance lower than that of the first layer 44A.

The first layer 44A may be formed by depositing the polysilicon layer through a deposition process and then performing an etch-back process. Alternatively, the first layer 44A may be formed by growing the polysilicon layer from the source layer 30 and the dummy channel pattern 36C through a selective growing process. The second layer 44B may be formed by depositing the metal layer including tungsten, or the like and then performing a planarization process such that a surface of the first interlayer insulating layer 41 is exposed.

Thereafter, a second interlayer insulating layer 47 including bit lines 45 and a well pick-up line 46 is formed. The bit lines 45 may be coupled with the respective channel structures CH, and the well pick-up line 46 may be coupled with the dummy channel structures D_CH. The bit lines 45 and the well pick-up line 46 may be disposed on the same level or different levels. When the second layer 44B of the source pick-up line 44 is formed, contact plugs of the bit lines 45 and the well pick-up line 46 may be formed along with the second layer 44B.

According to the above-described manufacturing method, since the coupling structure CN is formed in the second opening OP including the hemispherical recess regions R, the source pick-up line 44 and the coupling structure CN may be easily coupled with each other. Furthermore, since the source layer 30 includes the supports SP, a defect such as collapse, inclination, or the like of the stack may be prevented from occurring during the manufacturing process.

Figure 15:
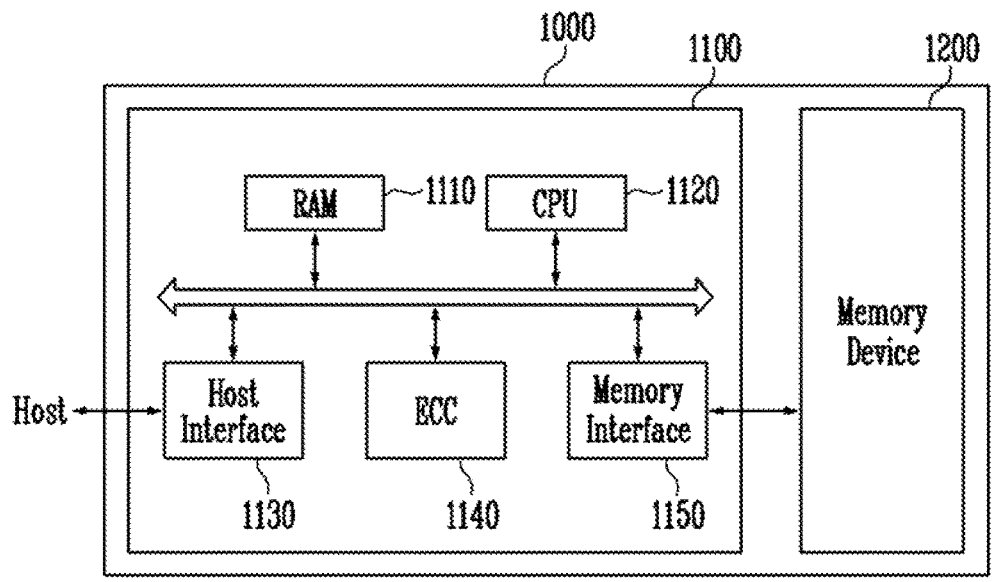
FIGS. 15 and 16 are block diagrams illustrating the configuration of a memory system according to an embodiment of the present disclosure.

FIG. 15 is a block diagram illustrating the configuration of a memory system according to an embodiment of the present disclosure.

Referring FIG. 15, a memory system 1000 according to an embodiment of the present disclosure includes a memory device 1200 and a controller 1100.

The memory device 1200 is used to store data information having a variety of data forms such as text, graphics, and software codes. The memory device 1200 may be a non-volatile memory. Furthermore, the memory device 1200 may have a structure described above with reference to FIGS. 1A to 14, and may be manufactured by the manufacturing method described above with reference to FIGS. 1A to 14. In an embodiment, the memory device 1200 may include a stack; channel structures passing through the stack; a coupling structure which is disposed below the stack and coupling the channel structures with each other and has an uneven lower surface; and a source pick-up line passing through the stack and coupled to the coupling structure. The structure of the memory device 1200 and the manufacturing method thereof are the same as those described above; therefore, detailed explanation thereof will be omitted.

The controller 1100 may be coupled to a host Host and the memory device 1200. The controller 1100 may access the memory device 1200 in response to a request from the host Host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may be used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 may be configured to operate firmware such as a flash translation layer (FTL) stored in the RAM 1110.

The host interface 1130 may be configured to interface with the host Host. For example, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCIe) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may be configured to interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. In addition the controller 1100 may further include a ROM that stores code data for interfacing with the host Host.

Since the memory system 1000 according to the embodiment includes the memory device 1200 having improved integration and characteristics, the integration and characteristics of the memory system 1000 may also be improved.

Figure 16:
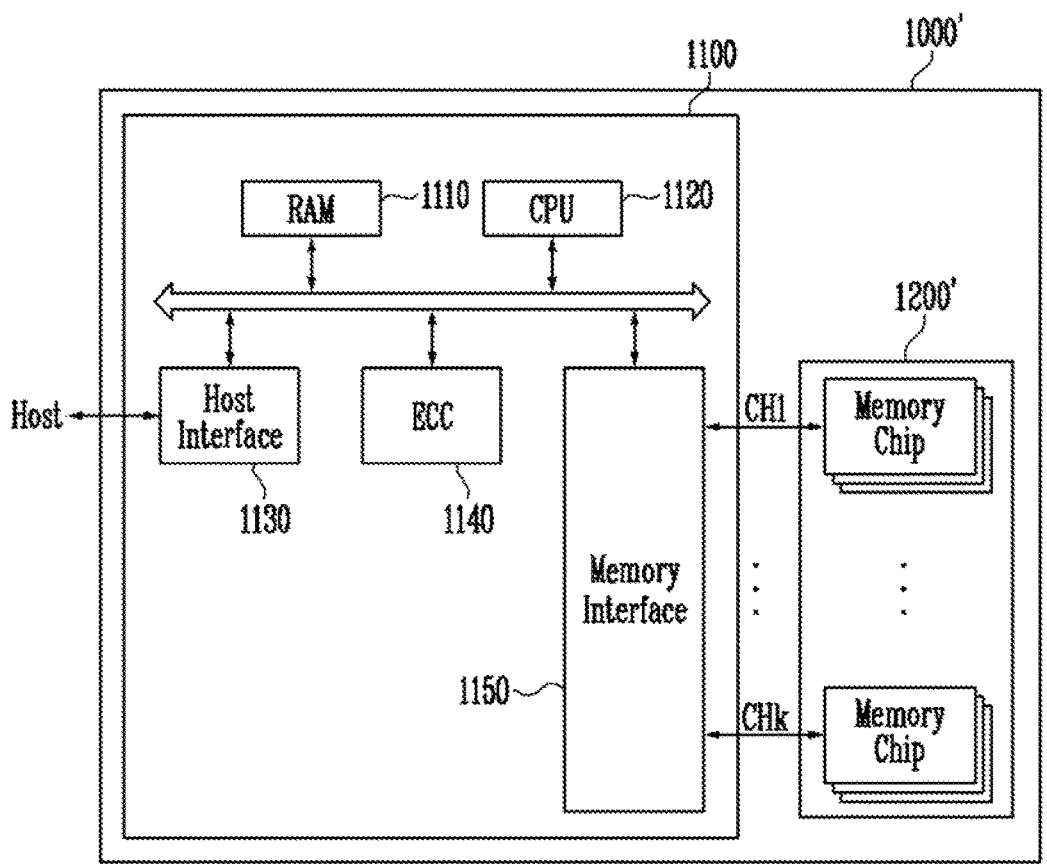

FIG. 16 is a block diagram illustrating the configuration of a memory system according to an embodiment of the present disclosure. Hereinbelow, repetitive explanation will be omitted if deemed redundant.

Referring to FIG. 16, a memory system 1000' according to an embodiment may include a memory device 1200' and a controller 1100. The controller 1100 includes a RAM 1110, a CPU 120, a host interface 1130, an ECC circuit 1140, a memory interface 1150, and so on.

The memory device 1200' may be a nonvolatile memory. Furthermore, the memory device 1200' may have a structure described above with reference to FIGS. 1A to 14, and may be manufactured by the manufacturing method described above with reference to FIGS. 1A to 14. In an embodiment, the memory device 1200' may include a stack; channel structures passing through the stack a coupling structure which is disposed below the stack and coupling the channel structures with each other and has an uneven lower surface; and a source pick-up line passing through the stack and coupled to the coupling structure. The structure of the memory device 1200' and the manufacturing method thereof are the same as those described above; therefore, detailed explanation thereof will be omitted.

Furthermore, the memory device 1200' may be a multi-chip package including a plurality of memory chips. The plurality of memory chips may be divided into a plurality of groups. The plurality of groups may be configured to communicate with the controller 1100 through first to k-th channels CH1 to CHk. The memory chips of each group may communicate with the controller 1100 through a common channel. For reference, the memory system 1000' may be modified such that each single memory chip is coupled to a corresponding single channel.

As described above, since the memory system 1000' according to the embodiment includes the memory device 1200' having improved integration and characteristics, the integration and characteristics of the memory system 1000' may also be improved. In particular, the memory device 1200' is formed of a multi-chip package, whereby the data storage capacity and the operating speed thereof can be enhanced.

Figure 17:
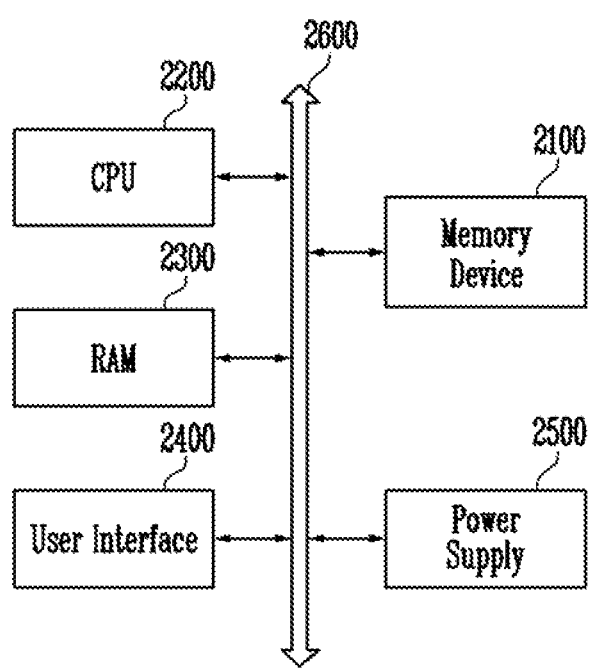
FIGS. 17 and 18 are block diagrams illustrating the configuration of a computing system according to an embodiment of the present disclosure.

FIG. 17 is a block diagram illustrating the configuration of a computing system according to an embodiment of the present disclosure. Hereinbelow, repetitive explanation will be omitted if deemed redundant.

Referring to FIG. 17, the computing system 2000 according to an embodiment of the present disclosure may include a memory device 2100, a CPU 2200, a RAM 2300, a user interface 2400, a power supply 2500, and a system bus 2600 operatively coupling the various components together.

The memory device 2100 may store data which are provided via the user interface 2400, and/or data processed by the CPU 2200. The memory device 2100 is electrically coupled to the CPU 2200, the RAM 2300, the user interface 2400, the power supply 2500 via the system bus 2600. For example, the memory device 2100 may be coupled to the system bus 2600 via a controller (not shown) or alternatively, directly coupled to the system bus 2600. In the case where the memory device 2100 is directly coupled to the system bus 2600, the function of the controller may be performed by the CPU 2200 or the RAM 2300.

The memory device 2100 may be a nonvolatile memory. Furthermore, the memory device 2100 may have a structure described above with reference to FIGS. 1A to 14, and may be manufactured by the manufacturing method described above with reference to FIGS. 1A to 14. In an embodiment, the memory device 2100 may include a stack; channel structures passing through the stack; a coupling structure which is disposed below the stack and coupling the channel structures with each other and has an uneven lower surface and a source pick-up line passing through the stack and coupled to the coupling structure. The structure of the memory device 2100 and the manufacturing method thereof are the same as those described above; therefore, detailed explanation thereof will be omitted.

As described above with reference to FIG. 16, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

Figure 18:
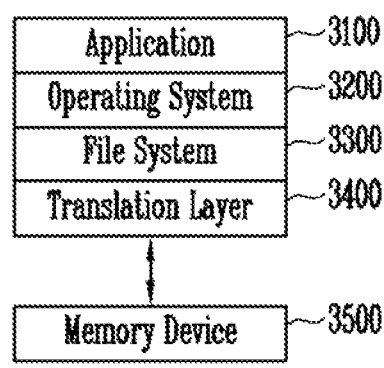

FIG. 18 is a block diagram illustrating a computing system according to an embodiment of the present disclosure.

Referring to FIG. 18, the computing system 3000 according to an embodiment of the present disclosure may include a software layer which has an operating system 3200, an application 3100, a file system 3300, a translation layer 3400, and so forth. Furthermore, the computing system 3000 includes a hardware layer such as a memory device 3500.

The operating system 3200 manages software resources and hardware resources, etc. of the computing system 3000 and may control program execution by the CPU. The application 3100 may be various application programs executed in the computing system 3000 and may be a utility executed by the operating system 3200.

The file system 3300 may refer to a logical structure for controlling data, files, etc. which are present in the computing system 3000 and may organize files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL) a universal flash storage link layer (ULL), or the like.

The memory device 3500 may be a nonvolatile memory. Furthermore, the memory device 3500 may have a structure described above with reference to FIGS. 1A to 14, and may be manufactured by the manufacturing method described above with reference to FIGS. 1A to 14. In an embodiment, the memory device 3500 may include a stack; channel structures passing through the stack; a coupling structure which is disposed below the stack and coupling the channel structures with each other and has an uneven lower surface; and a source pick-up line passing through the stack and coupled to the coupling structure. The structure of the memory device 3500 and the manufacturing method thereof are the same as those described above; therefore detailed explanation thereof will be omitted.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration and characteristics, the characteristics of the computing system 3000 may also be improved.

The present disclosure may provide a semiconductor device having a stable structure and improved reliability. In manufacturing the semiconductor device, the manufacturing process may be facilitated, and a procedure thereof may be simplified, and the manufacturing cost may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack;
   a plurality of channel structures passing through the stack;
   a coupling structure disposed below the stack for coupling the channel structures with each other, wherein a bottom of the coupling structure has first regions corresponding to the channel structures and second regions between the first regions, and the first regions are lower than the second regions; and
   a source pick-up line electrically coupled with the coupling structure.

2. The semiconductor device according to claim 1, wherein the first regions are coupled to each other in a mesh shape.

3. The semiconductor device according to claim 1, further comprising:
a source layer disposed below the coupling structure, the source layer being electrically coupled to the coupling structure through the source pick-up line.

4. The semiconductor device according to claim 3, wherein the source layer comprises supports protruding into the coupling structure for supporting the stack.

5. The semiconductor device according to claim 1, further comprising:
a plurality of dummy channel structures passing through the stack, wherein the plurality of dummy channel structures are coupled with the channel structures through the coupling structure.

6. The semiconductor device according to claim 5, further comprising:
first pads coupled with respective channel structures, each of the first pads including an N-type impurity; and
second pads coupled with the respective dummy channel structures, each of the second pads including a P-type impurity.

7. The semiconductor device according to claim 5, further comprising:
a well pick-up line electrically coupled with the dummy channel structures.

8. The semiconductor device according to claim 1, wherein the source pick-up line comprises:
an N-type polysilicon layer contacting the coupling structure; and
a metal layer disposed on the polysilicon layer.

9. The semiconductor device according to claim 8, wherein the polysilicon layer of the source pick-up line has a hemispherical lower surface.

10. A semiconductor device comprising:
a stack;
a plurality of channel structures passing through the stack;
a source layer disposed below the stack and including an opening having an uneven lower surface; and
a coupling structure formed in the opening of the source layer and coupling the plurality of channel structures with each other.

11. The semiconductor device according to claim 10, wherein the opening comprises hemispherical regions disposed below the respective channel structures.

12. The semiconductor device according to claim 11, wherein each of the hemispherical regions has a width greater than a width of each of the channel structures, and
wherein the hemispherical regions disposed adjacent to each other in a first direction are spaced apart from each other and the hemispherical regions disposed adjacent to each other in a second direction intersecting the first direction are overlapped with each other.

13. The semiconductor device according to claim 11, wherein the source layer comprises supports protruding between the hemispherical regions.

14. The semiconductor device according to claim 10, further comprising:
a source pick-up line passing through the stack and coupled to the source layer and the coupling structure.

15. The semiconductor device according to claim 14, wherein the source pick-up line has a hemispherical lower surface.

16. The semiconductor device according to claim 14, wherein the source pick-up line comprises:
an N-type polysilicon layer contacting the coupling structure; and
a metal layer disposed on the polysilicon layer.

17. The semiconductor device according to claim 10, further comprising:
dummy channel structures passing through the stack and coupled with the channel structures through the coupling structure.

18. The semiconductor device according to claim 17, further comprising:
first pads coupled with the respective channel structures, each of the first pads including an N-type impurity; and
second pads coupled with the respective dummy channel structures, each of the second pads including a P-type impurity.

19. The semiconductor device according to claim 17, further comprising:
a well pick-up line electrically coupled with the dummy channel structures.

20. A semiconductor device comprising:
a stack;
a plurality of channel structures passing through the stack;
a coupling structure disposed under the stack and coupling the channel structures with each other, wherein a bottom of the coupling structure has hemispherical regions corresponding to the channel structures; and
a source pick-up line electrically coupled with the coupling structure.

\* \* \* \* \*